United States Patent
Sakai et al.

(10) Patent No.: US 6,486,601 B1
(45) Date of Patent: Nov. 26, 2002

(54) ORGANIC LUMINESCENCE DEVICE WITH REDUCED LEAKAGE CURRENT

(75) Inventors: Toshio Sakai; Chishio Hosokawa, both of Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/485,698

(22) PCT Filed: Jun. 23, 1999

(86) PCT No.: PCT/JP99/03339

§ 371 (c)(1),
(2), (4) Date: Mar. 13, 2000

(87) PCT Pub. No.: WO00/01203

PCT Pub. Date: Jan. 6, 2000

(30) Foreign Application Priority Data

Jun. 26, 1998 (JP) .......................................... 10-180640

(51) Int. Cl.$^7$ ................................................. H01J 1/62
(52) U.S. Cl. ........................ 313/504; 313/506; 313/507
(58) Field of Search ................................. 313/504, 506, 313/507, 500, 502, 503, 505

(56) References Cited

U.S. PATENT DOCUMENTS 6,064,151 A * 5/2000 Choong et al. ............. 313/504

FOREIGN PATENT DOCUMENTS

| JP | 4-297076 A | 10/1992 |
| JP | 5-331458 A | 12/1993 |
| JP | 9-102395 A | 4/1997 |
| JP | 9-148071 A | 6/1997 |

* cited by examiner

Primary Examiner—Vip Patel
Assistant Examiner—Ken A Berck
(74) Attorney, Agent, or Firm—Oblon, Spivak, McClelland, Maier & Neustadt, P.C.

(57) ABSTRACT

The present invention relates to a luminescent device having a plurality of organic EL (Electroluminescence) elements in which at least a charge injection layer and a light-emitting layer are interposed between a pair of electrodes. It is a luminescent device in which plural sets of anodes and cathodes are arranged opposite to each other, and the charge injection layer and the light-emitting layer are formed between these anodes and cathodes, whereby a plurality of the organic EL elements can be controlled independently luminescence. The conductivity σ of the charge injection layer is set such that a leakage current from the organic EL element is 1/100 or less of the current passed through the organic EL element.

9 Claims, 6 Drawing Sheets

ORGANIC LUMINESCENCE DEVICE WITH REDUCED LEAKAGE CURRENT

TECHNICAL FIELD

The present invention relates to a luminescence device having a plurality of organic EL (Electroluminescence) elements in which at least a charge injection layer and a light-emitting layer are interposed between a pair of electrodes.

BACKGROUND OF THE INVENTION

Since an electroluminescence element (hereinafter referred to as an "EL element") using electroluminescence causes luminescence, the visibility is high and the element is a completely solid state element so that it is excellent in the impact durability. Accordingly, its use as a luminescence element in various display devices has attracted much interest.

The EL elements include an inorganic EL element obtained by using an inorganic compound as a luminous material and an organic EL element obtained by using an organic compound as a luminous material. Especially in the organic EL element of these, the driving voltage is quite low as compared with the inorganic EL element, and the element can further easily be downsized. Accordingly, studies and developments to achieve practical use have been increasingly conducted.

In order to achieve the organic EL element to practical use, the increase in efficiency of the element performance and the improvement in the life time are indispensable. For solving these problems, the improvements in the luminous material and the device structure have been carried out.

As the organic EL element, an element based on a multilayered structure of anode/organic luminous layer/cathode and provided on this with a hole injection transport layer or an electron injection transport layer as a charge injection layer, as required, for example, an element having a construction of anode/hole injection transport layer/organic luminous layer/cathode, an element having a construction of anode/hole injection transport layer/organic luminous layer/electron injection transport layer/cathode or the like is known.

The hole injection transport layer here has a function of injecting holes efficiently from an anode and transporting the holes to the luminous layer, and it is, in many cases, constructed of a hole injection layer and a hole transporting layer.

Further, the electron injection transport layer has a function of injecting electrons efficiently from a cathode at good efficiency and transporting the electrons to the luminous layer. The light-emitting layer has a function of emitting light by recombination of holes and electrons injected. By the way, this electron injection transport layer is sometimes constructed of an electron injection layer and an electron transport layer.

It is considered that such an organic EL element can also be applied to various display devices. In constructing a display device with an organic EL element, it is considered to employ a dot matrix panel in which a plurality of organic EL elements are capable of simple matrix driving.

At this time, as a method for producing a display device with the use of organic EL elements, a method can be employed in which a substrate which is made of glass and on which surface transparent anode electrodes formed of an ITO (Indium Tin Oxide) film are patterned in striped shape is used, predetermined materials are vacuum-deposited in order on the surface of this substrate to form a plurality of organic EL elements containing at least a charge injection layer and a light-emitting layer, and a metal is deposited thereon to form cathode electrodes.

Incidentally, in this method, the respective layers constituting the organic EL element, such as the charge injection layer, the luminous layer and the like, are generally deposited uniformly on the surface of the above-described substrate.

In the display device produced by such a method, the edge of the transparent electrode formed on the substrate, for example, the ITO electrode, is steep, so that the thickness of the film formed on the side surface of the ITO electrode tends to be smaller than that of the other portion and a defect of electrical shortcircuiting sometimes occurs.

Further, in a display device having a display ability with higher resolution, total extension of the ITO electrode formed on the substrate is increased, and the length of the steep edge is increased, with the result that possibility of causing a defect of shortcircuiting is increased.

For this reason, when a hole injection layer as a charge injection layer is formed, it is a common practice that the film thickness of the hole injection layer is increased and the ITO electrode is completely covered with the hole injection layer to conceal the edge of the ITO electrode with the hole injection layer whereby the defect of shortcircuiting does not occur even though the edge of the ITO electrode is steep. This is because a conductivity of a hole injection layer is usually so high that the increase in the driving voltage is controlled to be relatively moderate when increasing the film thickness.

Meanwhile, in order to realize an organic EL element with high performance, it is indispensable to reduce the dissipation power thereof, and to this end, the decrease in the driving voltage is attempted. For example, in Japanese Patent Laid-Open No. 145192/1992 and Japanese Patent Laid-Open No. 45479/1997, it is proposed that the driving voltage is decreased by employing a conductive polymer having a high conductivity as a material of a hole injection layer formed on an organic EL element.

However, when a conductive polymer having a high conductivity is employed as a material of a hole injection layer, a film thickness of a hole injection layer is increased in the above-described display device. Accordingly, a DC resistance between a plurality of organic EL elements adjoined is decreased. There is a problem that when a voltage is applied to one organic EL element, a leakage current is passed through another organic EL element, and an unselected organic EL element is also ignited.

DISCLOSURE OF THE INVENTION

It is an object of the present invention to provide a luminescence device in which ignition of, among a plurality of organic EL elements provided, those other than the selected is prevented without impairing the decrease in the driving voltage.

The present invention is a luminescence device in which plural sets of anodes and cathodes are arranged opposite to each other and an charge injection layer and a light-emitting layer are formed between these anodes and cathodes whereby a plurality of organic EL elements can be emissive independently, characterized in that the conductivity a of the charge injection layer is set such that a leakage current from the organic EL element is 1/100 or less of a current passed through the organic EL element. In particular the conductivity a of the charge injection layer is set such that a leakage current from the organic EL element to the adjacent organic EL elements 1/100 or less of the current passed through the organic EL element.

In the present invention, the conductivity is set such that the leakage current from one organic EL element to another organic EL element(adjacent organic EL elements) among a plurality of the organic EL elements is satisfactorily small. Consequently, even though a voltage is applied to one selected organic EL element, an unselected organic EL element is not ignited.

Further, when the conductivity is set, as required, according to a size of electrodes constituting an anode and a cathode connected to an organic EL element, a gap of electrodes and the like, an organic EL element can be driven at low voltage even though employing such a conductivity that a leakage current from the organic EL element is 1/100 or less of a current passed through the organic EL element. Thus, the decrease in the driving voltage is not impaired.

Numerals are as follows.

1 is an organic EL element, 2 a luminescence device, 11 an anode, 12 a cathode, 13 a rectangular portion in which mutually opposite surfaces of the anode and the cathode face each other, 14 a hole injection layer, 15 a hole transport layer, 16 a luminous layer, 17 an electron transport layer, 18 an insulation film, $V_0$ a voltage applied to an organic EL element, $J_0$ a current density of a current passed through the organic EL element, $l_1$ a gap between adjacent organic EL elements, $d_2$ a size of a side along an array direction of the organic EL element in the rectangular portion, $d_3$ a thickness of the anode and $d_4$ a gap between the anode and the cathode, respectively.

BEST MODE FOR CARRYING OUT THE INVENTION

The mode for carrying out the present invention is described below.

The following description is given in the case the charge injection layer is a hole injection layer. However, the same discussion is also applicable when it is an electron injection layer.

Figure 1:
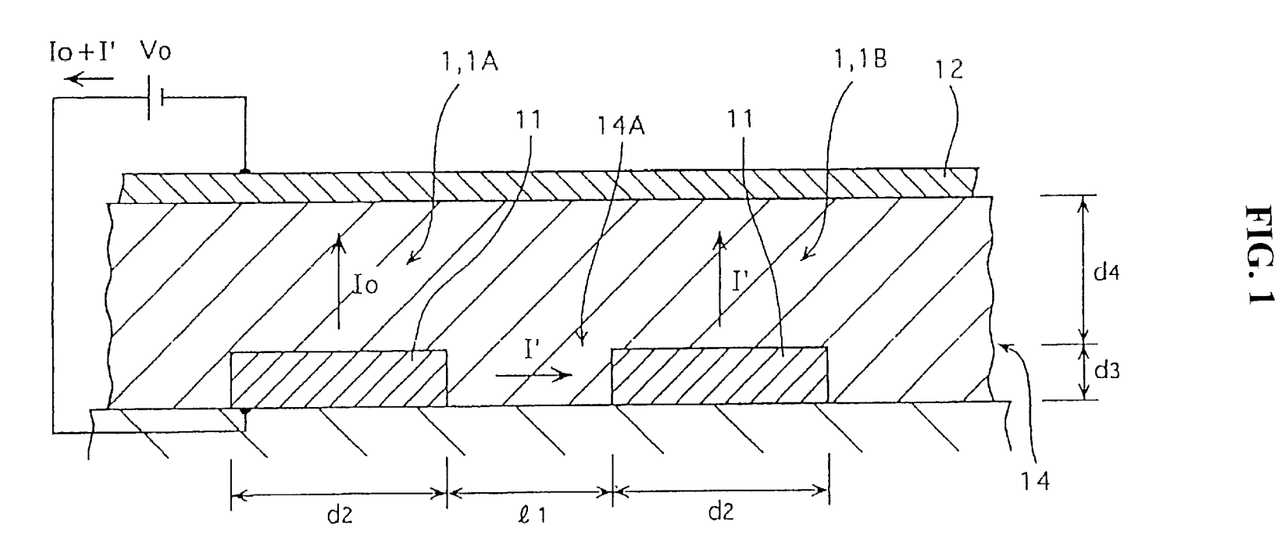
FIG. 1 is a sectional view for explaining the principle and the function of the present invention.
Figure 2:
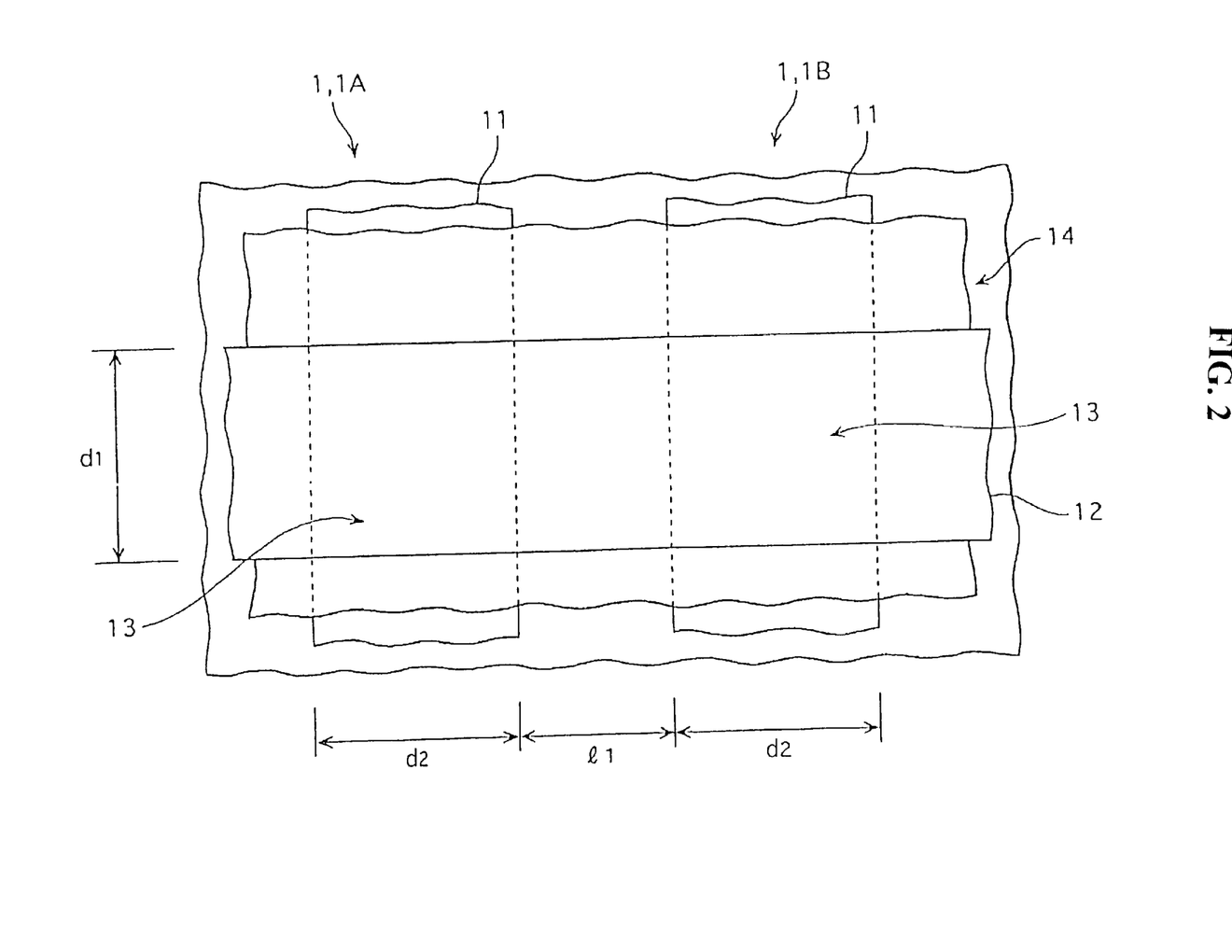
FIG. 2 is a plan view for explaining the principle and the function of the present invention.

The present invention is specifically described by referring to FIGS. 1 and 2. In the plural sets of the anodes 11 and the cathodes 12, it is advisable that a portion 13 in which mutually opposite surfaces face each other is rendered rectangular with the same area and the conductivity σ of the hole injection layer 14 is set at $J_0 d_4/10 < \sigma < l_1 d_2 J_0/(100 \cdot d_3 V_0)$.

Incidentally, in FIGS. 1 and 2, the layers other than the hole injection layer 14 are omitted. $V_0$ is a voltage applied to the organic EL element 1, $J_0$ is a current density of a current $I_0$ passed through the organic EL 1, $l_1$ is a gap between the adjacent organic EL elements 1, $d_2$ is a size of a side along the array direction of the organic EL element 1 among sides of the rectangular portion 13 in which the anode 11 and the cathode 12 face each other, $d_3$ is a thickness of the anode 11, and $d_4$ is a gap between the anode 11 and the cathode 12. By the way, in FIG. 2, $d_1$ is a size of a side along a direction intersecting the array direction of the organic EL element 1 among the sides of the rectangular portion 13 in which the anode 11 and the cathode 12 face each other.

The principle and the function of the present invention are described below.

Figure 3:
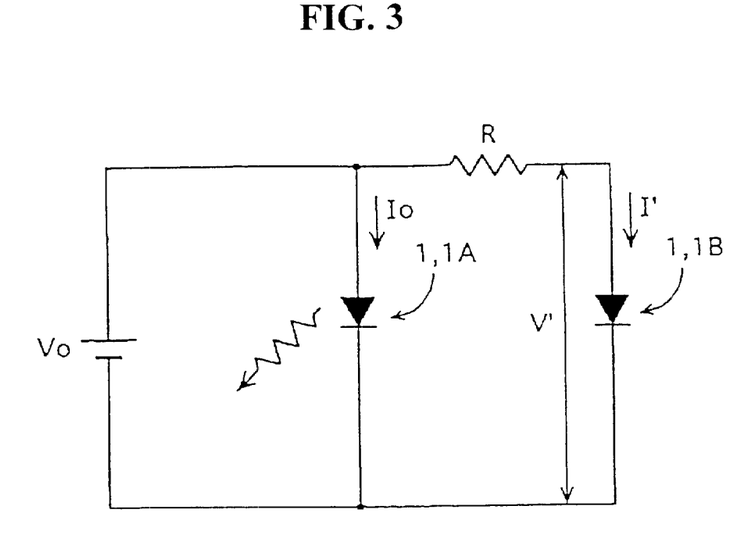
FIG. 3 is an equivalent circuit diagram for explaining the principle and the function of the present invention.

In FIG. 1, when the voltage $V_0$ is applied to the selected organic EL element 1A of the two organic EL elements 1A, 1B, the current $I_0$ is passed through the organic EL element 1A, and a leakage current I' is passed through the adjacent organic EL element 1B. In this luminescence device, a DC resistance R is formed, as in an equivalent circuit of FIG. 3, from the hole injection layer or the electron injection layer 14A between the organic EL elements 1A, 1B. This DC resistance R is represented by the following formula 1.

$$R = l_1/(\sigma d_1 d_3) \qquad \text{formula 1}$$

Further, the voltage V' at both ends of the organic EL element 1B is a value obtained by subtracting the voltage drop of the DC resistance R from the voltage $V_0$. Thus, the current I' passed through the organic EL element 1B is represented by the following formula 2.

$$I' = (V_0 - V')/R \qquad \text{formula 2}$$

Figure 4:
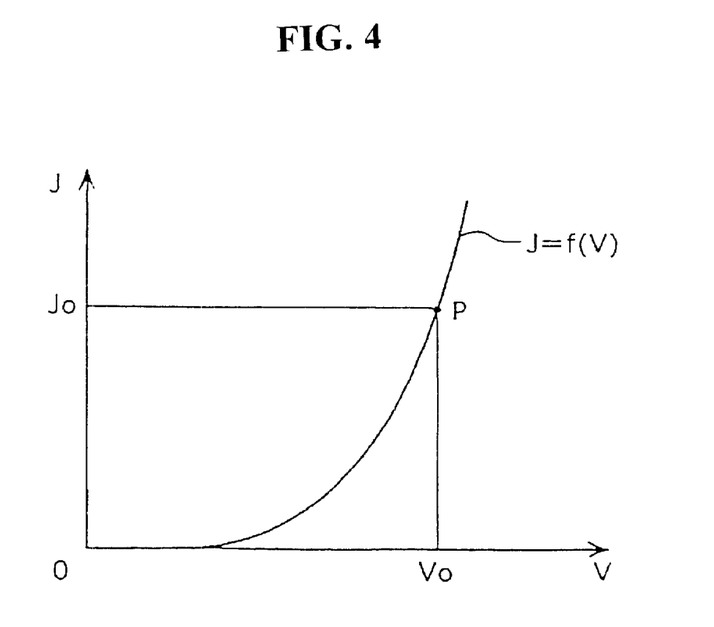
FIG. 4 is a graphical representation for explaining the principle and the function of the present invention.

Here, the relation between the current density J and the applied voltage V of the organic EL element 1 is, as shown in FIG. 4, expressed by a non-linear function f(V). Here, a point indicated by coordinates $(V_0, J_0)$ is a driving point P of the organic EL element 1A.

The current density J' of the organic EL element 1B is obtained by dividing the current I' by an area $S (=d_1 d_2)$ of the rectangular portion 13. Therefore, in the relation between the current I' passed through the organic EL element 1B and the voltage V', the equation represented by the following formula 3 is obtained with the use of the above-described function f (V)

$$J' = I'/(d_1 d_2) = f(V') \qquad \text{formula 3}$$

Further, the equation represented by the following formula 4 is obtained from the above-described formula 2.

$$J' = I'/(d_1 d_2) = (V_0 - V')/(d_1 d_2 R) \qquad \text{formula 4}$$

Figure 5:
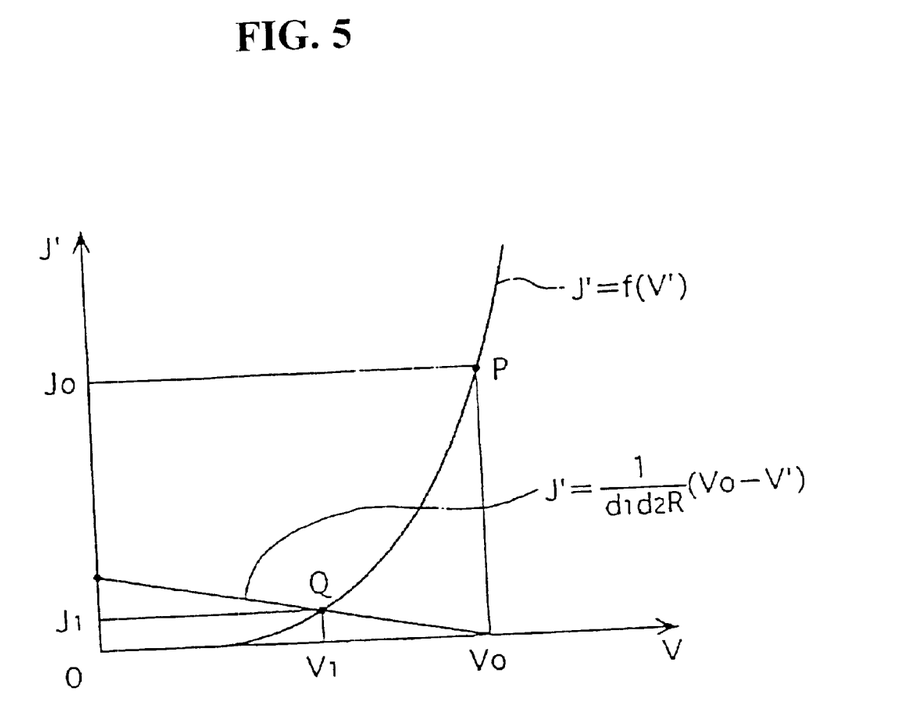
FIG. 5 is a graph for explaining the principle and the function of the present invention, which is different from FIG. 4.

Accordingly, when the voltage $V_0$ is applied to the organic EL element 1A, the voltage V' applied to the organic EL element 1B and the current I' passed through the adjacent organic EL element 1B are, as shown in FIG. 5, determined from coordinates $(V_1, J_1)$ in which the curve drawn by J'=f(V') and the line drawn by $J'=(V_0-V')/(d_1 d_2 R)$ intersect.

And, in order not to switch on the adjacent organic EL element 1B when it is unselected, it is advisable that the current density J' when the adjacent organic EL element 1B is unselected is 1/100 or less of the current density $J_0$ of the current $I_0$ passed when the organic EL element 1A is selected and driven. Thus, the following formula 5 is established.

$$J_1 < J_0/100 \quad \text{formula 5}$$

Here, the formula 5 is estimated using $J(V'=0)$ instead of $J_1$. In order not to switch on the adjacent organic EL element 1B when it is not selected, it is advisable that R is set to meet the following formula 6.

$$V_0/(d_1 d_2 R) < J_0/100 \quad \text{formula 6}$$

And, when formula 6 is modified by using formula 1 in formula 6, the following formula 7 is obtained. When the conductivity a to meet such a formula 7 is set, it is possible to prevent the organic EL element 1B from being ignited when it is undriven, and the upper limit of the conductivity a is defined by the following formula 7.

$$\sigma < l_1 d_2 J_0/(100 \cdot d_3 V_0) \quad \text{formula 7}$$

However, actually because of $J_1 < J (V'=0)$, the upper limit of $\sigma$ obtained from $J_1 < J_0/100$ is, to be exact, somewhat larger than formula 7.

Meanwhile, when the voltage drop $\Delta V$ of the hole injection layer 14 in the voltage application is less than 10 V, it is said that the organic EL element 1 can be driven (ignited) at low voltage. This voltage drop $\Delta V$ is represented by the following formula 8.

$$\begin{aligned}\Delta V &= I_0 \cdot 4_4 / (\sigma d_1 d_2) \\ &= J_0 d_1 d_2 \cdot d_4 / (\sigma d_1 d_2) \\ &= J_0 d_4 / \sigma < 10\end{aligned} \quad \text{formula 8}$$

Accordingly, when the conductivity $\sigma$ to meet the following formula 9 is set, it is possible to drive (ignite) the organic EL element 1 at low voltage, and the lower limit of the conductivity $\sigma$ is defined by formula 9.

$$J_0 d_4/10 < \sigma \quad \text{formula 9}$$

In the foregoing, it is advisable that a plurality of electrodes extending in strip shape are arrayed in the width direction as the anodes, a plurality of electrodes extending in strip shape and intersecting the anodes are arrayed in the width direction as the cathodes, and a plurality of the organic EL elements described above can be operated under simple matrix driving by these anodes and cathodes. Furthermore, the principle mentioned above can be applied to the organic EL elements under an active matrix driving. In this case, a plurality of electrodes is meant that (at least) one set of anodes and cathodes can be united each other to form a common electrode (a common anode or common cathode).

This makes it possible to drive a plurality of the organic EL elements arrayed two-dimensionally at random and at high speed, and a thin type display having a high performance is realized for television set or for a personal computer.

The charge injection layer is preferably a combination of an organic compound and an oxidative dopant, a combination of an organic compound and a reductive dopant or a combination of an organic compound and conductive fine particles.

Specifically, as the preferable combination of the organic compound and the conductive fine particles, a material obtained by incorporating and dispersing conductive metallic particles or conductive inorganic particles in an organic compound ordinarily used in an organic EL element, for example, polyvinyl carbazole, polyaniline, polystyrene, amine derivatives, porphyrin, phthalocyanine or the like is mentioned.

Further, as the type of the conductive fine particles, gold, silver, copper, nickel, solder, aluminum, indium oxide, tin oxide, zinc oxide and the like are mentioned which are used singly or in combination. Still further, it is advisable that the average particle diameter of the conductive metallic particles is a value in the range of 0.001 to 1 $\mu$m. Furthermore, it is advisable that the amount of the conductive fine particles added is a value in the range of 0.1 to 50 parts by weight per 100 parts by weight of the organic compound.

In addition, as the combination of the organic compound and the oxidative dopant, the followings are mentioned. That is, the organic compound has a hole-transporting unit, and the hole-transporting unit comprises (1) a polymer or a co-polymer formed by linking hole transporting units mutually with a bond or (2) a mixture of a non-conjugated polymer or a co-polymer hole-transporting small molecule. Here, (1) the polymer or co-polymer formed by linking hole transporting units mutually with the non-conjugated or conjugated bond includes also an oligomer.

Specifically, examples of the organic compound include a polycarbonate or a polyether containing an amine in a main chain, an amine oligomer, polyvinyl carbazole and a mixture of a polycarbonate and an amine compound. Examples of the oxidative dopant include compounds such as quinone derivatives, halogenated metals, Lewis acids, organic acids, halogenated metal salts, Lewis acid salts, fullerenes, organic acid salts and the like.

Accordingly, more specific examples of the combination of the organic compound and the oxidative dopant can include polyvinyl carbazole and antimony chloride, polyaniline and antimony chloride, amine derivatives and C60 (fullerene), NPD (N,N'-bis(naphthyl-1-yl)-N,N'-diphenyl-4,4'-benzidine) and thioketone, porphyrin and tetracyanoquinodimethane (TCNQ), copper phthalocyanine and tetracyanoethylene (TCNE), an amine oligomer and DDQ, amine dendrimer and DDQ, polyamide compound, $FeCl_3$ and the like.

Here, DDQ is a compound represented by the following structural formula.

By the way, when the organic compound and the oxidative dopant are combined, the addition ratio to the organic compound is preferably a value in the range of 1:1 to 20:1 (molar ratio). This is because when the addition ratio of the organic compound and the oxidative dopant is outside the range, the luminance of the organic EL element is, in some cases, decreased, or the life is shortened. Accordingly, the addition ratio of the organic compound and the oxidative dopant is more preferably a value in the range of 1:1 to 10:1 (molar ratio), further preferably a value in the range of 1:1 to 5:1.

In addition, with respect to the combination of the organic compound and the reductive dopant, it is preferable to combine an organic compound selected from Alq (tris(8-hydroxyquinoline)aluminum), DPAVBi (4,4'-bis[2-{4-(N,N-diphenylamino)phenyl}vinyl]biphenyl), PBD and the like with at least one reductive dopant selected from the group consisting of an alkali metal, an alkaline earth metal, a rare earth metal, an alkali metal oxide, an alkali metal halide, an alkaline earth metal oxide, an alkaline earth metal halide, a rare earth metal oxide and a rare metal halide. Moreover, the amount of the reductive dopant added can be the same value as the addition ratio of the oxidative dopant to the organic compound. By the way, the organic compound has preferably an electron-transporting, and the alkali metal is preferably Cs or Li. Here, PBD is a compound represented by the following structural formula.

However, when the charge injection layer is a hole injection layer, the combination of the organic compound and the oxidative dopant or the combination of the organic compound and the conductive fine particles is more preferable because the hole injection property becomes better. Further, when the charge injection layer is an electron injection layer, the combination of the organic compound and the reductive dopant or the combination of the organic compound and the conductive fine particles is more preferable because the electron injection property becomes better.

Especially, when the charge injection layer is an electron injection layer, the combination of the electron-transporting compound and the reductive dopant is preferable.

Electron-transporting Compound

As the electron-transporting compound, any compound can widely be used as long as it has a function of transporting electrons injected from a cathode to an organic luminous medium. Specifically, for example, an aromatic cyclic compound made of an aromatic ring free of a nitrogen atom (which is sometimes simply referred to as a "nitrogen-free heterocyclic compound") and an organic compound containing a nitrogen-containing heterocyclic compound (which is sometimes simply referred to as a "nitrogen-containing heterocyclic compound") can be mentioned.

(1) Nitrogen-free Heterocyclic Compound

The nitrogen-free heterocyclic compound is defined as a compound containing an aromatic ring made of carbon (C) and hydrogen (H) or a compound containing an aromatic ring made of carbon (C), hydrogen (H) and oxygen (O). However, it may contain a nitrogen atom in a molecule other than the aromatic ring. It is rather preferable that aromatic rings free of a nitrogen atom are bound with, for example, a nitrogen atom. Further, the compound of the aromatic ring made of carbon and hydrogen and the compound of the aromatic ring made of carbon, hydrogen and oxygen may be used either singly or in combination.

Such a nitrogen-free heterocyclic compound is used in combination with the reductive dopant described later to obtain an excellent electron injection property, and a reaction with a constituent material of an adjacent luminous zone can be suppressed. That is, the nitrogen-free heterocyclic compound is composed of an aromatic ring made of carbon and hydrogen or an aromatic ring made of carbon, hydrogen and oxygen, and it is free of a nitrogen-containing aromatic ring or a nitrogen-containing group such as an electrically attractive group (for example, a —CN group, a —NO$_2$ group, an amide group or an imide group). Consequently, it is possible to suppress efficiently the occurrence of a charge transfer complex or an exciplex having a low luminous efficiency in the interface between the electron injection zone and the luminous zone.

As a preferable nitrogen-free heterocyclic compound, an aromatic cyclic compound comprises at least one aromatic ring selected from the group consisting of anthracene, fluorene, perylene, pyrene, phenanthrene, chrysene, tetracene, rubrene, terphenylene, quarterphenylene, sexiphenylene, triphenylene, picene, coronen, diphenylanthracene, benz[a]anthracene and binaphthalene.

Moreover, it is further preferable that the nitrogen-free heterocyclic compound has a styryl group-substituted aromatic ring, a distyryl group-substituted aromatic ring or a tristyryl group-substituted aromatic ring. The luminance or the life of the organic EL element can be further improved by having such a styryl group-substituted (including distyryl group-substituted and tristyryl group-substituted. This is applied to the following) aromatic ring.

With respect to such an aromatic cyclic compound having the styryl group-substituted group, for example, the same aromatic cyclic compounds as aromatic cyclic compounds represented by general formulas (10) to (12) which are used in the organic luminous medium can be mentioned.

(10)

[wherein Ar$^1$ is an aromatic group having 6 to 40 carbon atoms, Ar$^2$, Ar$^3$ and Ar$^4$ are each a hydrogen atom or an aromatic group having 6 to 40 carbon atoms and at least one is an aromatic group, and the number n of condensation is an integer of 1 to 6.]

(11)

[wherein Ar$^5$ is an aromatic group having 6 to 40 carbon atoms, Ar$^6$ and Ar$^7$ are each a hydrogen atom or an aromatic group having 6 to 40 carbon atoms, at least one of Ar$^5$, Ar$^6$ and Ar$^7$ is substituted by a styryl group, and the number m of condensation is an integer of 1 to 6.]

(12)

[wherein Ar$^9$ to Ar$^{13}$ are each an aromatic group having 6 to 40 carbon atoms, Ar$^8$ and Ar$^{14}$ are each a hydrogen atom or an aromatic group having 6 to 40 carbon atoms, at least one of Ar$^8$ to Ar$^{14}$ is substituted by a styryl group, and the numbers p, q, r and s of condensation are each 0 or 1.]

(2) Nitrogen-containing Heterocyclic Compound

Further, as the electron-transporting compound, a nitrogen-containing heterocyclic compound can be mentioned. Even when such a nitrogen-containing heterocyclic compound is used, it is possible to suppress efficiently the reaction with an organic luminous medium material and obtain a high luminance by using a reductive dopant having a work function of 2.9 eV or less among reductive dopants described later.

Such a nitrogen-containing heterocyclic compound is defined as a compound having a heterocyclic ring containing a nitrogen atom. Specific examples include a nitrogen-containing complex and a nitrogen-containing cyclic compound. Preferable examples of the nitrogen-containing complex include a metal complex having an 8-quinolinol derivative as a ligand, phthalocyanine derivatives and metal phthalocyanines. Further, preferable examples of the nitrogen-containing cyclic compound include oxadiazole derivatives, thiadiazole derivatives, triazole derivatives, quinoxaline derivatives, quinoline derivatives and the like. Further, preferable examples of the nitrogen-containing heterocyclic compound can include heterocyclic tetracarboxylic acid anhydrides such as anthrone derivatives, freorenylimethane derivatives, carbodiimide, naphthaleneperylene and the like.

Reductive Dopant (1) Type

The reductive dopant is defined as a substance which can reduce an aromatic cyclic compound when it is oxidized. Accordingly, the type of the reductive dopant is not particularly limited so long as it has a fixed reductivity. However, it is preferably the same type as that of the reductive dopant used in the electron injection layer.

More specifically, preferable examples of the alkali metal include Li (lithium, work function: 2.93 eV), Na (sodium, work function: 2.36 eV), K (potassium, work function: 2.3 eV), Rb (rubidium, work function: 2.16 eV) and Cs (cesium, work function: 1.95 eV). By the way, the parenthesized values of the work functions are those described in Kagaku Binran (Kisohen II, p. 493, compiled by Chemical Society of Japan). The same applies to the following.

Further, preferable examples of the alkaline earth metal include Ca (calcium, work function: 2.9 eV), Mg (magnesium, work function: 3.66 eV), Ba (barium, work function: 2.52 eV) and Sr (strontium, work function: 2.0 to 2.5 eV). Incidentally, the value of the work function of strontium is described in Physics of Semiconductor Device (N.Y. Weilow, 1969, p. 366).

Further, preferable examples of the rare earth metal include Yb (ytterbium, work function: 2.6 eV), Eu (europium, work function: 2.5 eV), Gd (gadolinium, work function: 3.1 eV) and En (erbium, work function: 2.5 eV).

Further, preferable examples of the alkali metal oxide include $Li_2O$, LiO and NaO. In addition, preferable examples of the alkaline earth metal oxide include CaO, BaO, SrO, BeO and MgO.

Further, preferable examples of the alkali metal halide include LiCl, KCl and NaCl other than fluorides such as LiF, NaF and KF. In addition, preferable examples of the alkaline earth metal halide include fluorides such as $CaF_2$, $BaF_2$, $SrF_2$, $MgF_2$ and $BeF_2$, and halides other than fluorides. Preferable examples of the rare earth metal halide include fluorides such as $LaF_3$, $YbF_3$, $EuF_3$ and the like.

Further, as a preferable reductive dopant, an aromatic compound in which an alkali metal is coordinated is mentioned. This aromatic compound in which the alkali metal is coordinated is represented by, for example, the following general formula (13).

$$A^+ Ar^{20-} \quad\quad\quad (13)$$

In general formula (13), A represents an alkali metal, and $Ar^{20}$ is an aromatic compound having 10 to 40 carbon atoms. Examples of the aromatic compound represented by this formula (13) include anthracene, naphthalene, diphenylanthracene, terphenyl, quaterphenyl, quinquphenyl, sexiphenyl and derivatives thereof.

(2) Amount Added

It is advisable that the amount added of the reductive dopant in the electron injection zone is set at a value in the range of 0.01 to 50% by weight when the total material constituting the electron injection zone is defined as 100% by weight. When the amount added of the reductive dopant is less than 0.01% by weight, there is a tendency that the luminance of the organic EL element is decreased or the life is shortened. Meanwhile, when the amount added of the reductive dopant exceeds 50% by weight, there is a tendency that the luminance is rather decreased or the life is shortened.

Accordingly, from the standpoint of ameliorating the balance of the luminance and the life, it is more preferable that the amount added of the reductive dopant is set at a value in the range of 0.2 to 20% by weight.

Further, with respect to the amount added of the reductive dopant, it is preferable that the addition ratio of the aromatic cyclic compound and the reductive dopant is set at a value in the range of 1:20 to 20:1 (molar ratio). When the addition ratio of the electron-transporting compound and the reductive dopant is outside the range, there is a tendency that the luminance of the organic EL element is decreased or the life is shortened.

Accordingly, the addition ratio of the aromatic cyclic compound and the reductive dopant is preferably set at a value in the range of 1:10 to 10:1 (molar ratio), more preferably at a value in the range of 1:5 to 5:1.

Electron Affinity

The electron affinity of the electron injection zone is preferably set at a value in the range of 1.8 to 3.6 eV. When the value of the electron affinity is less than 1.8 eV, there is a tendency that the electron injection property is decreased and the increase in the driving voltage and the decrease in the luminous efficiency are caused. Meanwhile, when the value of the electron affinity exceeds 3.6 eV, a complex having a low luminous efficiency tends to be generated or occurrence of blocking junction can be generated.

Accordingly, the electron affinity of the electron injection zone is more preferably set at a value in the range of 1.9 to 3.0 eV, further preferably at a value in the range of 2.0 to 2.5 eV.

Further, as the material of the hole injection layer in the charge injection layer, a conductive polymer can be employed. For example, polyaniline, polythienylenevinylene, polyarylenevinylene, polythiophene and the like are mentioned.

Thus, when the hole injection layer made of the conductive polymer is employed, the conductive polymer is dissolved in a solution of chloroform or the like. In the film formation, a spin coating method in which the film formation is conducted at atmospheric pressure or the like can be employed, and the film formation of the hole injection layer is easily carried out.

Or, as the material of the hole injection layer in the charge injection layer, an inorganic semiconductor can be employed. Examples thereof include α-Si, μc-Si, μc-Sic, CdS, CdSSe, CdTe, amorphous carbon and crystalline carbon. As the amorphous carbon and the crystalline carbon, diamond-like carbon, diamond, nitrogen-containing carbon, phosphorous-containing carbon and the like can be employed.

Thus, when the hole injection layer formed of the inorganic semiconductor is employed, the conductivity σ of the hole injection layer can precisely be determined by adjusting the amount of the dopant added to the inorganic semiconductor, and the conductivity σ defined by formulas 7 and 9 can be determined easily and surely.

Further, one mode for carrying out the present invention is described by referring to the drawings.

Figure 6:
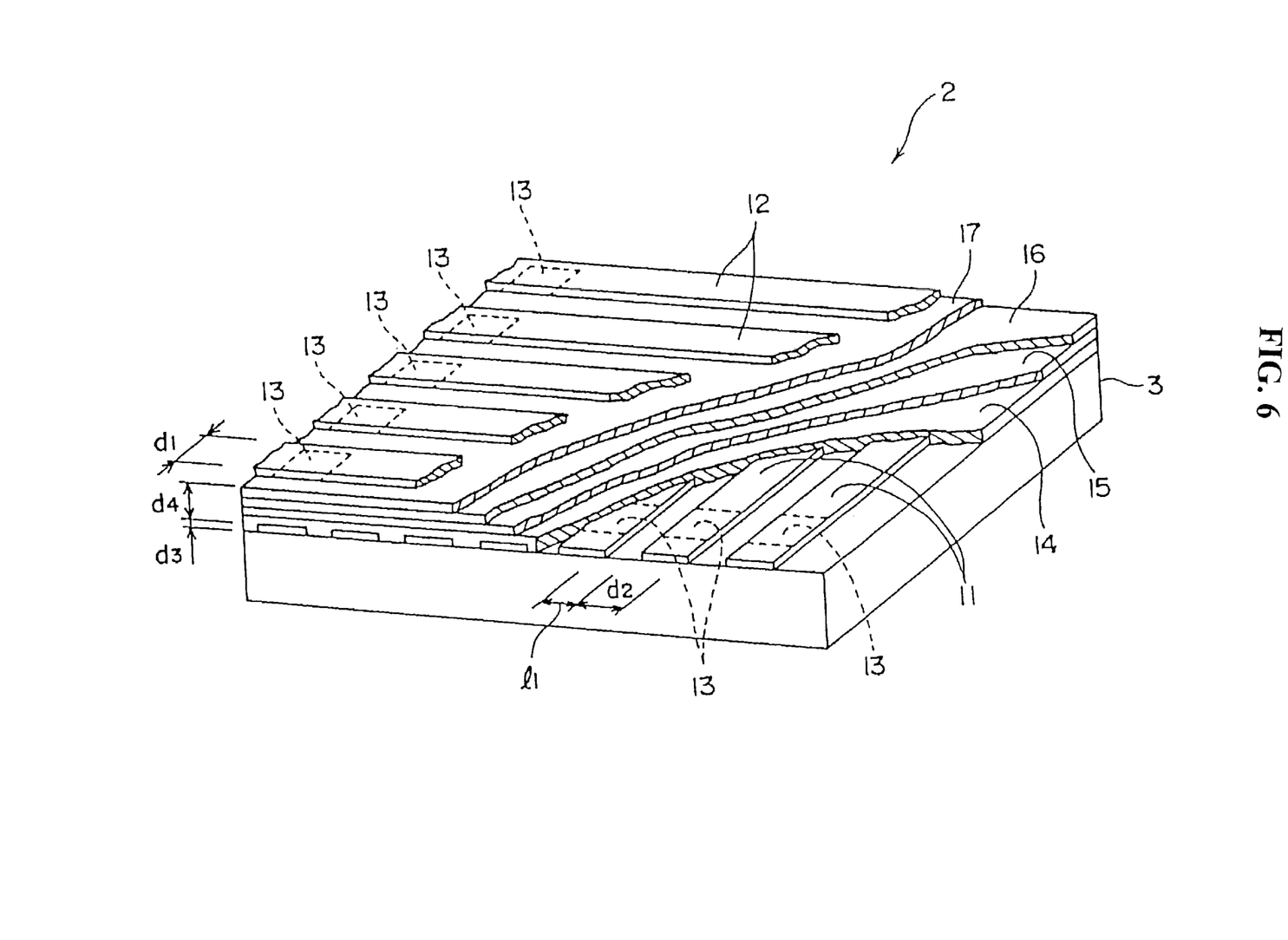
FIG. 6 is a partially cross sectional perspective view showing a luminescence device according to one mode for carrying out the present invention.

A luminescence device 2 of the present mode is shown in FIG. 6. This luminescence device 2 has a transparent substrate 3 and an anode 11 and a cathode 12 which are opposite to each other.

The anode 11 is a transparent electrode formed on the surface of the substrate 3, and extended in strip shape. A plurality of the anodes are arrayed in the width direction.

The cathode 12 is an electrode extending in strip shape in the direction intersecting the anode 11. A plurality of the cathodes are arrayed in the width direction.

These anodes 11 and cathodes 12 have a large number of rectangular portions 13 in which mutually opposite surfaces face each other and which are rectangular with the same area.

Between these anodes 11 and cathodes 12, a hole injection layer 14, a hole transport layer 15, a luminous layer 16 and an electron transport layer 17 are formed in this order from the side of the substrate 3.

Consequently, spaces between the large number of the rectangular portions 13 that the anodes 11 and the cathodes 12 share respectively are made organic EL elements 1 (not shown) can be emitted independently, and a plurality of the organic EL elements 1 can be capable of single matrix driving by these anodes 11 and cathodes 12. And, luminescences of the organic EL elements 1 are drawn outside through the substrate 3.

At this time, the substrate 3 is formed of a transparent material such as glass or the like. The anode 11 is formed of a transparent conductive material such as an ITO film or the like. The cathode 12 is formed of a conductive material such as a metal or the like appropriate for deposition. The hole injection layer 14 is formed of a non-conjugated polymer, a hole-transporting low-molecular compound and an oxidative dopant.

Further, a gap $1_1$ between the anodes 11 which is a gap between the adjacent organic EL elements 1 is set at 30 μm. A width $d_1$ of the cathode which is a size of a side along a direction intersecting the array direction of the organic EL element 1 among sides of the rectangular portion 13 is set at 300 μm, and a width $d_2$ of the anode 11 which is a size of a side along a direction intersecting the array direction of the organic EL element 1 among sides of the rectangular portion 13 is set at 300 μm. And, a thickness $d_3$ of the anode 11 is set at 100 nm, and a gap $d_4$ between the anode 11 and the cathode 12 is set at 200 nm.

Specifically, in the case of the present device, $V_0$ applied to the organic EL element 1 is set at 10 V, and a current density $J_0$ of a current $I_0$ passed through the organic EL element is set at 150 mA/cm$^2$.

In such a luminescence device 2, the conductivity σ of the hole injection layer 14 is calculated on the basis of formulas 7 and 9. Then, it has to be set at higher than $3 \times 10^{-5}$ S/m and lower than $1.35 \times 10^{-1}$ S/m. Specifically, it is approximately $4 \times 10^{-4}$ S/M.

According to this mode, the following effects are obtained.

That is, the conductivity a of the hole injection layer 14 formed on the luminescence device 2 is set to be $J_0 d_4 / 10 < 1_1 d_2 J_0 / (100 \cdot d_3 V_0)$, and the current density J' of the leakage current in the organic EL element 1 is set to be 1/100 or less of the current density $J_0$ of the current $I_0$ passed in the driving of another adjacent organic EL element 1. Consequently, the switching of, among a plurality of the organic EL elements provided, those other than the selected can be prevented, and a satisfactory luminance can be secured even under the driving at low voltage. When it is utilized as a display device, the contrast can be improved.

Further, as the anode 11, a plurality of transparent electrodes which are formed on the surface of the substrate 3, which extend in strip shape and which are arrayed in the width direction are employed. And, as the cathode 12, a plurality of electrodes which extend in strip shape in the direction intersecting the anodes 11 and which are arrayed in the width direction are employed. A plurality of the organic EL elements 1 are capable of simple matrix driving by these anodes 11 and cathodes 12. Consequently, the large number of the organic EL elements 1 which are arrayed two-dimensionally can be driven at random and at high speed, making it possible to realize a thin product having a high performance as a display for television set or a display for a personal computer.

Further, when the material of the hole injection layer 14 is dissolved in a solution of chloroform or the like, a spin coating method in which film formation is conducted at atmospheric pressure or the like can be employed in the film formation, and the film-forming procedure of the hole injection layer 14 can easily be carried out.

Examples including specific procedures for producing the luminescence device 2 having the structure in the above-described mode are described below.

EXAMPLE 1

Production Procedures

A substrate 3 which is made of a transparent glass and on which surface a transparent electrode of an ITO film is formed is employed. This substrate 3 is adapted to have a size of width 100 mm×length 120 mm×thickness 1.1 mm.

Further, the transparent electrode formed on the surface of the substrate 3 becomes an anode 11 of the luminescence device 2, and a plurality of strip electrodes having a width ($d_2$) of 300 μm and a thickness ($d_3$) of 120 nm are arrayed in the width direction, and patterned in striped shape. A gap $1_1$ between the adjacent strip electrodes of the transparent electrodes is set at 20 μm.

First, such a substrate 3 is ultrasonically cleaned with isopropyl alcohol for 5 minutes, then cleaned with pure water for 5 minutes, and thereafter again ultrasonically cleaned with isopropyl alcohol for 5 minutes. When the ultrasonic cleaning is completed, dry nitrogen is sprayed to remove isopropyl alcohol from the surface of the substrate 3, and then UV/ozone cleaning is conducted.

Subsequently, a hole injection layer 14 formed of a non-conjugated polymer, a hole-transport small molecular compound and an oxidative dopant is formed on the substrate 3 by a spin coating method. That is, as a starting material of the hole injection layer 14, a solution obtained by dissolving 47 mg of polycarbonate (hereinafter abbreviated as "PC"), 112 mg of N,N'-diphenyl-N,N'-bis(3-methylphenyl)-[1,1'-biphenyl]-4,4'-diamine (hereinafter abbreviated as "TPD") and 112 mg of tris (4-bromophenyl) aluminum hexachloroantimonate (hereinafter abbreviated as "TBAHA") in 5 ml of chloroform such that the conductivity σ becomes approximately $4 \times 10^{-4}$ S/M is employed.

This solution is dropped on the substrate 3 which is rotated (2,000 rpm), and the film formation is conducted on the surface of the substrate 3 by the spin coating. Then, the substrate 3 is dried in air at a temperature of 85° C. for 1 hour, whereby a hole injection film 14 made of a PC:TPD:TBAHA mixture and having a thickness of 200 nm is completed on the surface of the substrate 3.

Next, a hole transport layer 15, a light-emitting layer 16 and an electron transport layer 17 are formed in this order on the hole injection layer 14 formed on the substrate 3.

Specifically, as a starting material of the hole transport layer 15, 4,4'-bis[N-phenyl-N-(1-naphthyl)-4-aminophenyl] triphenylamine (hereinafter abbreviated as "TPD 78") is employed.

As a starting material of the light-emitting layer 16, a mixture of 9,10-di[4-(2,2'-diphenylvinyl-1-yl)phenyl] anthracene (hereinafter abbreviated as "DPVDPAN") and 4,4'-bis[2-{4-(N,N-diphenylamino)phenyl}vinyl]biphenyl (hereinafter abbreviated as "DPAVBi") is employed.

As a starting material of the electron transport layer 17, tris(8-hydroxyquinoline)aluminum (hereinafter abbreviated as "Alq") is employed. Further, in the vacuum deposition, a commercial available vacuum deposition apparatus (supplied by Nippon Shinku Gijutsu) is employed.

When the vacuum deposition is conducted, first, the substrate 3 on which the hole injection layer 14 is formed is fixed on a substrate holder of the vacuum deposition apparatus, 200 mg of TPD 78, 200 mg of DPVDPAN, 200 mg of DPAVBi and 100 mg of Alq are charged respectively in four resistance heating boats made of molybdenum which are mounted on the vacuum deposition apparatus.

Subsequently, a vacuum chamber of the vacuum deposition apparatus is sealed, and the pressure inside the vacuum chamber is reduced to $1.0 \times 10^{-4}$ Pa. Then, the resistance heating boat containing TPD 78 is heated to evaporate TPD 78, and the hole transport layer 15 having a film thickness of 20 nm is formed on the hole injection layer 14 formed on the substrate 3.

When the film formation of the hole transport layer 15 is completed, the resistance heating boat containing DPVDPAN and the resistance heating boat containing DPAVBi are heated simultaneously to evaporate DPVDPAN and DPAVBi, and the light-emitting layer 16 having a film thickness of 40 nm is formed on the hole transport layer 15 formed on the substrate 3. Here, the mixing ratio of DPVDPAN and DPAVABi in the light-emitting layer 16 is 40:1 in terms of a weight ratio.

When the film formation of the light-emitting layer 16 is completed, the resistance heating boat containing Alq is heated to evaporate Alq, and the electron transport layer 17 having a film thickness of 20 nm is formed on the light-emitting layer 16 formed on the substrate 3.

Then, the film formation of the cathode 12 is conducted. Before this, the substrate 3 on which the film formation of up to the electron transport layer 17 is completed is withdrawn from the vacuum chamber, and a mask made of stainless steel is mounted on the electron transport layer 17.

This mask is for patterning a large number of strip electrodes having a width ($d_1$) of 500 μm in such striped shape that these are arrayed in the width direction. Incidentally, a gap of the strip electrodes is set at 500 μm. Further, the direction of providing this mask is a direction in which the strip electrodes formed intersect the strip electrodes as the anodes 11.

Thereafter, the substrate 3 having the mask mounted thereon is fixed again on the substrate holder of the vacuum deposition apparatus, and an alloy base material made of aluminum (Al) and lithium (Li) and having an Li concentration of 5 atomic % is placed on the vacuum deposition apparatus as a deposition material.

And, the vacuum chamber of the vacuum deposition apparatus is sealed, and the pressure inside the vacuum chamber is reduced to $1.0 \times 10^{-4}$ Pa. Then, the above-described deposition material is heated. While the temperature of the deposition material is adjusted such that the deposition rate is in the range of 0.5 to 1.0 nm/sec, the deposition material is evaporated, whereby the cathode 12 having a film thickness of 150 nm is formed on the electron transport layer 17 formed on the substrate 3 to complete the luminescence device 2.

Here, the conductivity a of the hole injection layer 14 is calculated on the basis of formulas 7 and 9, and it has to be set at a value higher than $4 \times 10-5$ S/m and lower than $9 \times 10^{-2}$ S/m. When the conductivity a of the hole injection layer 14 of the luminescence device 2 was actually measured, the conductivity a was $4 \times 10^{-4}$ S/m.

Accordingly, it can be considered that among the plurality of the organic EL elements mounted on the luminescence device 2, only the selected one is switched on, that the switching of the others(the adjacent organic EL elements) is prevented and that the organic EL element can be driven at low voltage.

Next, the luminescence test of the luminescence device 2 produced in the above-described procedures is described.
[Luminescence Test]

Among a large number of the organic EL elements formed on the luminescence device 2 produced in the above-described procedures, the specific organic EL element was selected, and a DC voltage of 5.5 V was applied only to this organic EL element. Then, uniform blue luminescence was observed. Further, luminescence of those other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL element and the like, was not observed.

As an initial performance data of the organic EL element in the above-described DC voltage driving, a current density: 1.2 mA/cm$^2$, a luminance: 83 cd/m$^2$, a luminous efficiency: 7 cd/A and achromaticity: (0.184, 0.344) were obtained. From these, the organic EL element of the luminescence device 2 was found to have a high efficiency.

Further, as an initial performance data of the organic EL element in the above-described pulse voltage driving, a current density: 179 mA/cm$^2$, an instantaneous luminance: 9050 cd/m$^2$, a luminous efficiency: 5 cd/A and chromaticity: (0.180, 0.339) were obtained.

Further, all of the organic EL elements of the luminescence device 2 were ignited, and the surface of the luminescence device 2 was observed visually and with a luminance meter (CS-100, supplied by Minolta). Consequently, no unignited organic EL element was observed in the luminous surface, and the luminance of the organic EL elements could be said as uniform. , it was found that the luminescence device 2 was excellent in the uniformity of the luminescence.

EXAMPLE 2

[Production Procedures]

The production was conducted in the same manner as in Example 1 except that the hole injection layer 14 in Example 1 was formed by co-depositing copper phthalocyanine (CuPc) and DDQ at a ratio of 50:1 (angstrom/sec).

Here, DDQ is the above-described compound.

[Luminescence test]

Among a large number of the organic EL elements formed on the luminescence device 2 produced in the above-described procedures, the specific organic EL element was selected, and a DC voltage of 6.0 V was applied only to this organic EL element. Then, uniform blue luminescence was observed. Further, luminescence of elements other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL element and the like, was not observed.

As an initial performance data of the organic EL element in the above-described DC voltage driving, a current density: 1.8 mA/cm$^2$, a luminance: 92 cd/m$^2$, a luminous efficiency: 5.1 cd/A and a chromaticity: (0.180, 0.330) were obtained. From these, the organic EL element of the luminescence device 2 was found to have a high efficiency.

EXAMPLE 3

[Production Procedures]

The production was conducted in the same manner as in Example 1 except that the hole injection layer 14 in Example 1 was formed from TPDP and FeCl$_3$ at a weight ratio of 100:5 by a spin coating method.

Here, TPDP is a compound represented by the following structural formula.

[Luminescence Test]

Among a large number of the organic EL elements formed on the luminescence device 2 produced in the above-described procedures, the specific organic EL element was selected, and a DC voltage of 6.0 V was applied only to this organic EL element. Then, uniform blue luminescence was observed. Further, luminescence of elements other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL and the like, was not observed.

As an initial performance data of the organic EL element in the above-described DC voltage driving, a current density: 1.6 mA/cm$^2$, a luminance: 82 cd/m$^2$, a luminous efficiency: 5.1 cd/A and a chromaticity: (0.180, 0.340) were obtained. From these, the organic EL element of the luminescence device 2 was found to have a high efficiency.

EXAMPLE 4

[Production Procedures]

The production was conducted in the same manner as in Example 1 except that the hole injection layer 14 in Example 1 was formed from polymethyl methacrylate (PMMA) and antimony dope tin oxide at a weight ratio of 1:1 by a spin coating method.

[Luminescence Test]

Among a large number of the organic EL elements formed on the luminescence device 2 produced in the above-described procedures, the specific organic EL element was selected, and a DC voltage of 6.0 V was applied only to this organic EL element. Then, uniform blue luminescence was observed. Further, luminescence of elements other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL element and the like, was not observed.

As an initial performance data of the organic EL element in the above-described DC voltage driving, a current density: 1.5 mA/cm$^2$, a luminance: 76 cd/m$^2$, a luminous efficiency: 5.1 cd/A and a chromaticity: (0.182, 0.342) were obtained. From these, the organic EL element of the luminescence device 2 was found to have a high efficiency.

COMPARATIVE EXAMPLE 1

[Production Procedures]

The production was conducted in the same manner as in Example 1 except that the hole injection layer 14 in Example 1 was formed without using TBAHA.

[Luminescence Test]

Among the large number of the organic EL elements formed on the luminescence device 2 produced in the above-described procedures, the specific organic EL element was selected, and a DC voltage of 10 V was applied only to this organic EL element. Then, uniform blue luminescence was observed. Further, luminescence of elements other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL element and the like, was not observed.

As an initial performance data of the organic EL element in the above-described DC voltage driving, a current density: 1.0 mA/cm$^2$, a luminance: 50 cd/m$^2$, a luminous efficiency: 5 cd/A and a chromaticity: (0.184, 0.340) were obtained. In comparison with Example 1, the driving voltage was increased from 5.5 V to 10 V. In this case, the conductivity σ of the hole injection layer was lower than $10^{-6}$ S/m, and the value of the conductivity σ of the hole injection layer could not be rendered within the range of the present invention.

COMPARATIVE EXAMPLE 2

[Production Procedures]

The production was conducted in the same manner as in Example 1 except that the hole injection layer 14 in Example 1 was formed from polyaniline and camphor sulfonic acid.

[Luminescence Test]

Among a large number of the organic EL elements formed on the luminescence device 2 produced in the above-described procedures, the specific organic EL element was selected, and a DC voltage of 5.0 V was applied only to this organic EL element. Then, an unselected picture element caused luminescence.

Subsequently, the newly selected organic EL element alone was driven with a pulse voltage (duty ratio 1/100, voltage 10 V, basic frequency 60 Hz). Then, the other organic EL element adjacent to this organic EL element caused luminescence.

As an initial performance data of the organic EL element in the above-described DC voltage driving, a current density: 1.0 mA/cm$^2$, a luminance: 70 cd/m$^2$, a luminous efficiency: 7 cd/A and a chromaticity: (0.180, 0.340) were obtained. In this case, the conductivity σ of the hole injection layer was 1 S/m, exceeding the upper limit of the value of the conductivity σ in the present invention. Therefore, the picture element selectivity was lost.

EXAMPLE 5

[Production Procedures]

The production was conducted in the same manner as in Example 1 except that the hole injection layer 14 in Example 1 was formed by depositing TPD to 60 mm and the electron transport layer 17 in Example 1 was formed by co-depositing CuPc and Li at a ratio of 2:0.1 (angstrom/sec).

[Luminescence Test]

Among a large number of the organic EL elements formed on the luminescence device 2 produced in the above-described procedures, the specific organic EL element was selected, and a DC voltage of 6.0 V was applied only to this organic EL element. Then, uniform blue luminescence was observed. Further, luminescence of elements other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL element and the like, was not observed.

As an initial performance data of the organic EL element in the above-described DC voltage driving, a current density: 1.7 mA/cm$^2$, a luminance: 83 cd/m$^2$, a luminous efficiency: 4.9 cd/A and a chromaticity: (0.179, 0.330) were obtained. From these, the organic EL element of the luminescence device 2 was found to have a high efficiency.

EXAMPLE 6

[Production Procedures]

The production was conducted in the same manner as in Example 1 except that the electron transport layer 17 was formed by co-depositing Alq (tris(8-hydroxyquinoline) aluminum) and Cs at a ratio of 2:0.3 (angstrom/sec).

[Luminescence Test]

Among a large number of the organic EL elements formed on the luminescence device 2 produced in the above-described procedures, the specific organic EL element was selected, and a DC voltage of 6.0 V was applied only to this organic EL element. Then, uniform blue luminescence was observed. Further, luminescence of elements other than the selected was not observed.

Subsequently, the newly selected organic EL element alone was driven with a pulse voltage (duty ratio 1/100, voltage 10 V, basic frequency 60 Hz). Then, luminescence was observed only in this organic EL element. Meanwhile, luminescence of organic EL elements other than the selected, such as other organic EL elements adjacent to this organic EL and the like, was not observed.

As an initial performance data of the organic EL element in the above-described DC voltage driving, a current density: 1.6 mA/cm$^2$, a luminance: 83 cd/m$^2$, a luminous efficiency: 5.2 cd/A and a chromaticity: (0.180, 0.333) were obtained. From these, the organic EL element of the luminescence device 2 was found to have a high efficiency.

The present invention has been described above by referring to preferable modes and Examples. However, the present invention is not limited to these modes and Examples, and various modifications and changes in designing are possible as far as the gist of the present invention is not deviated.

Figure 7:
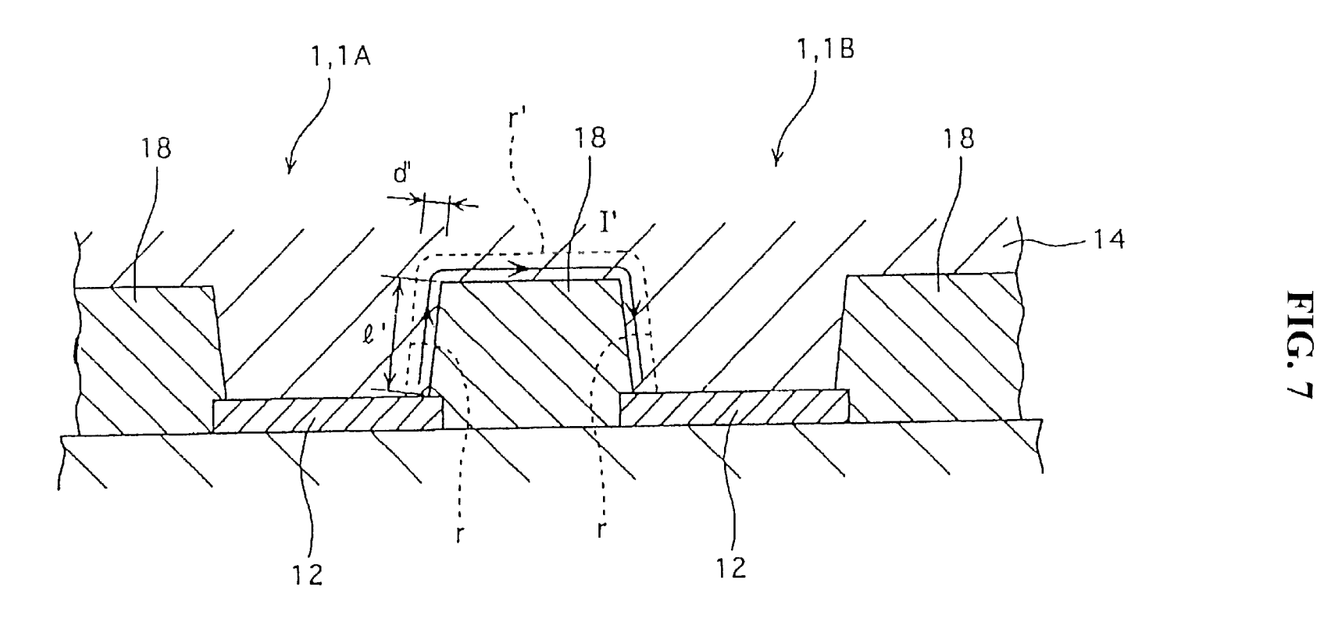
FIG. 7 is a sectional view showing a modification example of the present invention.

For example, the luminescence device is not limited to the one in which the hole injection layer is mounted between the anodes which are adjacent to each other. A device in which an insulation film 18 is formed between the anodes which are adjacent to each other can also be used as shown in FIG. 7. In this construction, the edge of ITO is protected with the insulation film 18, making it possible to obtain an effect that the leakage can effectively be prevented.

Here, a DC resistance R' formed between the organic EL elements 1A, 1B of the luminescence device is a sum of a DC resistance r' of the upper surface of the insulation film 18 and a DC resistance r of the two side surfaces of the insulation film 18, and the DC resistance r' is considered to be equal to the DC resistance R in the above-described Examples.

Therefore, the DC resistance R' is represented by the following formula 10', wherein l' is the length of a hole injection layer through which a leakage current is passed along the side surface of the injection film 18, and d' is the thickness of the hole injection layer through which the leakage current is passed.

$$R' = R + 2 \cdot r \qquad \text{formula 10}$$
$$= l_1 / (\sigma d_1 d_3) + 2 \cdot l' / (\sigma d_1 d')$$

In such a luminescence device, $l_1/l'$ is a value of approximately 20, $d_3/d'$ is a value of approximately 10 and the DC resistance R' is nearly equal to the DC resistance R. Accordingly, the range of the conductivity σ represented by formulas 7 and 9 can also be applied as such to the luminescence device in which the insulation film 18 is formed between the anodes 12 which are adjacent to each other.

Further, as the material of the hole injection layer, not only the conductive polymer but also the inorganic semiconductor can be used. When the hole injection layer made of the inorganic semiconductor is employed, the conductivity σ of the hole injection layer can be determined accurately by, for example, adjusting the amount of the dopant added to the inorganic semiconductor, and the conductivity σ defined by formulas 7 and 9 can be determined easily and surely.

Further, the luminescence device becomes not only a display device in which organic EL elements arrayed two-dimensionally can be operated under simple matrix driving to display an image and the like, but also a device in which organic EL elements are simply arrayed in a straight line, such as a level meter found in an audio product. In short, a device in which a plurality of organic EL elements are formed on integrated organic layers will do.

Industrial Applicability

As stated above, according to the present invention, ignition of, among a plurality of organic EL elements, those other than the selected can be prevented, a satisfactory luminance can be secured even in the driving at low voltage, and contrast can be improved in the use as a display device.

What is claimed is:

1. A luminescent device in which plural sets of anodes and cathodes are arranged opposite to each other and a charge injection layer and a light-emitting layer are formed between these anodes and cathodes whereby a plurality of organic EL elements can be controlled independently, wherein the conductivity a of the charge injection layer is set such that a leakage current from the organic EL element is 1/100 or less of a current passed through the organic EL element.

2. The luminescent device as claimed in claim 1, wherein in the plural sets of the anodes and the cathodes, a portion in which mutually opposite surfaces face each other is rendered rectangular with the same area, and the conductivity $\sigma$ of the said charge injection layer is selected such that $J_0 d_4/10 < \sigma < 1_1 d_2 J_0/(100 \cdot d_3 V_0)$ in which $V_0$ is a voltage applied to the organic EL element, $J_0$ is a current density of a current passed through the organic EL element, $l_1$ is a gap between the adjacent organic EL elements, $d_2$ is the size of a side along the array direction of the organic EL element among sides of the rectangular portion in which the anode and the cathode face each other, $d_3$ is a thickness of the anode, and $d_4$ is a gap between the anode and the cathode.

3. The luminescent device as claimed in claim 1, wherein a plurality of electrodes extending in strip shape are arrayed in the width direction as the anodes, a plurality of electrodes extending in strip shape and intersecting the anodes are arrayed in the width direction as the cathodes, and a plurality of said organic EL elements can be operated under simple matrix driving by these anodes and cathodes.

4. The luminescent device as claimed in claim 1, wherein the charge injection layer is a hole injection layer, and comprises an organic compound and an oxidative dopant.

5. The luminescent device as claimed in claim 4, wherein the organic compound has a hole-transporting unit, and the hole-transporting unit comprises (1) a polymer or a co-polymer formed by linking the hole transporting units mutually with a bond or (2) a mixture of a non-conjugated polymer and a hole-transporting small molecule.

6. The luminescent device as claimed in claim 1, wherein the charge injection layer is an electron injection layer, and comprises an organic compound and a reductive dopant.

7. The luminescent device as claimed in claim 6, wherein the organic compound is an electron-transporting compound.

8. The luminescent device as claimed in claim 1, wherein the charge injection layer is a hole injection layer, and comprises a conductive polymer.

9. The luminescent device as claimed in claim 1, wherein the charge injection layer is a hole injection layer, and comprises an inorganic semiconductor.

* * * * *